(12) United States Patent
Chevroulet

(10) Patent No.: US 8,947,107 B2
(45) Date of Patent: Feb. 3, 2015

(54) CAPACITANCE MEASUREMENT OF HIGH VOLTAGE DEVICE

(71) Applicant: Semtech Corporation, Camarillo, CA (US)

(72) Inventor: Michel Alain Chevroulet, Neuchatel (CH)

(73) Assignee: Semtech Corporation, Camarillo, CA (US)

(*) Notice: Subject to any disclaimer, the term of this patent is extended or adjusted under 35 U.S.C. 154(b) by 171 days.

(21) Appl. No.: 13/765,965

(22) Filed: Feb. 13, 2013

(65) Prior Publication Data

US 2014/0184248 A1    Jul. 3, 2014

Related U.S. Application Data

(60) Provisional application No. 61/702,196, filed on Sep. 17, 2012.

(51) Int. Cl.
*G01R 27/26* (2006.01)

(52) U.S. Cl.
CPC .......... *G01R 27/2605* (2013.01); *G01R 27/26* (2013.01)
USPC .......... 324/679; 324/686; 324/548; 345/173; 345/174

(58) Field of Classification Search
USPC ............ 324/686, 600, 679–684, 500, 519, 324/750.17, 754.28, 548, 658; 345/174, 345/173
See application file for complete search history.

(56) References Cited

U.S. PATENT DOCUMENTS

| | | | | |
|---|---|---|---|---|
| 4,914,382 | A * | 4/1990 | Douville et al. | 324/127 |
| 5,321,367 | A * | 6/1994 | Koscica et al. | 324/663 |
| 7,173,438 | B2 | 2/2007 | Pooranakaran et al. | |
| 7,825,670 | B2 | 11/2010 | Nie et al. | |
| 7,906,876 | B2 * | 3/2011 | Tang et al. | 310/12.18 |
| 8,188,755 | B2 | 5/2012 | Alini et al. | |
| 8,629,684 | B2 * | 1/2014 | Deschildre et al. | 324/661 |
| 2001/0003424 | A1 * | 6/2001 | Kuperman et al. | 324/676 |
| 2005/0104604 | A1 | 5/2005 | Mellert et al. | |
| 2006/0158200 | A1 * | 7/2006 | Eilersen | 324/667 |
| 2006/0273805 | A1 | 12/2006 | Peng et al. | |
| 2009/0289606 | A1 | 11/2009 | Lauxtermann et al. | |
| 2011/0163766 | A1 | 7/2011 | Geaghan | |
| 2012/0062244 | A1 | 3/2012 | Santana et al. | |

OTHER PUBLICATIONS

International Search Report for PCT Patent Application No. US13/55415 dated Jan. 17, 2014, 3 pages.

* cited by examiner

*Primary Examiner* — Melissa Koval
*Assistant Examiner* — Trung Nguyen
(74) *Attorney, Agent, or Firm* — Amin, Turocy & Watson, LLP

(57) ABSTRACT

Described herein are systems and methods that facilitate the measurement of the capacitance of high voltage devices while shielding an active device involved in the measurement from the high voltage. The systems and methods employ capacitors to store the high voltage such that the active device does not experience the high voltage. Placement of a reset device ensures that the active device is shielded from the high voltage.

20 Claims, 14 Drawing Sheets

CAPACITANCE MEASUREMENT OF HIGH VOLTAGE DEVICE

This application claims priority to U. S. Provisional Application No. 61/702,196 filed Sep. 17, 2012, the entirety of which is hereby incorporated by reference.

TECHNICAL FIELD

This disclosure generally relates to measurement of the capacitance of a high voltage device and more specifically relates measurement of the capacitance of a high voltage device without exposing active device involved in the measurement to the high voltage of the high voltage device.

BACKGROUND

An active device utilized integrated in the measurement of capacitance of a device is often limited with regard to the voltage it can be exposed to while conducting the measurement. The voltage limit can be due to a terminal or breakdown voltage that prevents the active device from receiving any voltages above the breakdown voltage without leaking significant current and dramatically reducing the life of the active device. Usual breakdown voltages in modern technologies can be in the range of 1 V to 10 V.

A high voltage device is generally a device that can operate under a voltage greater than the breakdown voltage of the active device. A capacitive microelectromechanical system (MEMS) device is an example of such a high voltage device. A capactive MEMS device facilitates the movement of elements by an applied voltage. The amount of movement does affect the capacitance of the capacitive MEMS device. Measurement of the capacitance of the capacitive MEMS device is difficult with a traditional capacitive measurement circuit circuit because the voltage required to move the elements a certain amount is often greater than the breakdown voltage of the active device of the traditional capacitive measurement circuit.

Traditional capacitance measurements are performed by connecting the high voltage device to a circuit, including the active device. However, this connection can significantly limit the voltage that can be applied to the high voltage device or can significantly limit the sensitivity of the circuit that facilitates the measurement. In fact, when the voltage applied to the device is higher than the breakdown voltage of the active device (as in the case of capacitive MEMS devices), the measurement of the capacitance of the high voltage device becomes impossible.

SUMMARY

The following presents a simplified summary to provide a basic understanding of some aspects of the subject disclosure. This summary is not an extensive overview of the disclosed subject matter. It is not intended to identify key or critical elements of the disclosed subject matter, nor is it intended to delineate the scope of the subject disclosure or the claims. Its sole purpose is to present some concepts of the disclosed subject matter in a simplified form as a prelude to the more detailed description presented later.

In a non-limiting embodiment of the subject disclosure, a system is described that facilitates the isolation of a high voltage that is applied to an external device (e.g., a high voltage external device like a capacitive MEMS device) in capacitance measurement. The system includes an amplifier with a positive input, a negative input, and an output and two capacitors that each store a high voltage. The first capacitor is connected to the negative input of the amplifier and to an external device with an unknown capacitance. The second capacitor is connected to the output of the amplifier and to the external device. The system also includes a voltage source device that supplies a low voltage to the positive input of the amplifier and a reset device that connects the output of the amplifier and the negative input of the amplifier. A detector device can measure a change in the output voltage of the amplifier as a function of a change in the low voltage supplied by the voltage source and function of the unknown capacitance of the external device.

In another non-limiting embodiment of the subject disclosure, a method is described that facilitates measurement of capacitance of an external device, even when the external device is exposed to a high voltage. The method includes storing a high voltage on the external device with an unknown capacitance, on a first capacitor between a negative input of an amplifier and the external device, and on a second capacitor connected between the output of the amplifier and the external device. A low voltage is then applied to a positive input of the amplifier. The voltage of the output of the amplifier and a voltage of the negative input of the amplifier are driven to the same low voltage via a reset device. The low voltage applied at the positive input of the amplifier can be modified, and the voltage change out of output of the amplifier can be measured. The voltage change at the output of the amplifier is proportional to the unknown capacitance and to the voltage change applied at the positive input of the amplifier.

In a further non-limiting embodiment of the subject disclosure, a capacitance measuring circuit is described. The capacitance measurement circuit is operational to measure the capacitance of an external device, even when the external device is exposed to a high voltage. The capacitance measuring circuit includes an amplifier that includes a positive input, a negative input, and an output, a first capacitor that stores a high voltage connected to the negative input of the amplifier and to the external device with an unknown capacitance, a second capacitor that stores the high voltage connected to the output of the amplifier and to the external device. The capacitance measuring circuit also includes a reset device that connects the output of the amplifier and the negative input of the amplifier and facilitates driving the output of the amplifier and the negative input of the amplifier to a low voltage supplied by a voltage source device to the positive input of the amplifier. Accordingly, a change in the output voltage of the amplifier as a result of a change of voltage supplied by the voltage source is a function of the unknown capacitance of the external device.

The following description and the annexed drawings set forth in detail certain illustrative aspects of the disclosed subject matter. These aspects are indicative, however, of a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of the embodiments of the subject disclosure. One skilled in the relevant art will recognize, however, that the embodiments described herein can be practiced without one or more of the specific details, or with other methods, components, materials, etc. In other instances, well-known structures, materials, or operations are not shown or described in detail to avoid obscuring certain aspects.

Described herein are systems and methods that facilitate the measurement of the capacitance of an external voltage device that operates under a high voltage (high voltage device) while shielding an active device involved in the measurement of the capacitance from the high voltage. The systems and methods can, for example, be utilized in the measurement of the capacitance of a high voltage device that operates with a voltage higher than the breakdown voltage of the active device involved in the measurement. The voltage of applied to the high voltage device is not limited based on the breakdown voltage of the active device. Accordingly, the systems and methods can avoid a loss of precision in the measurement principle, while avoiding extra electrodes or differential measurement system, thereby reducing costs and reducing size.

Figure 1:
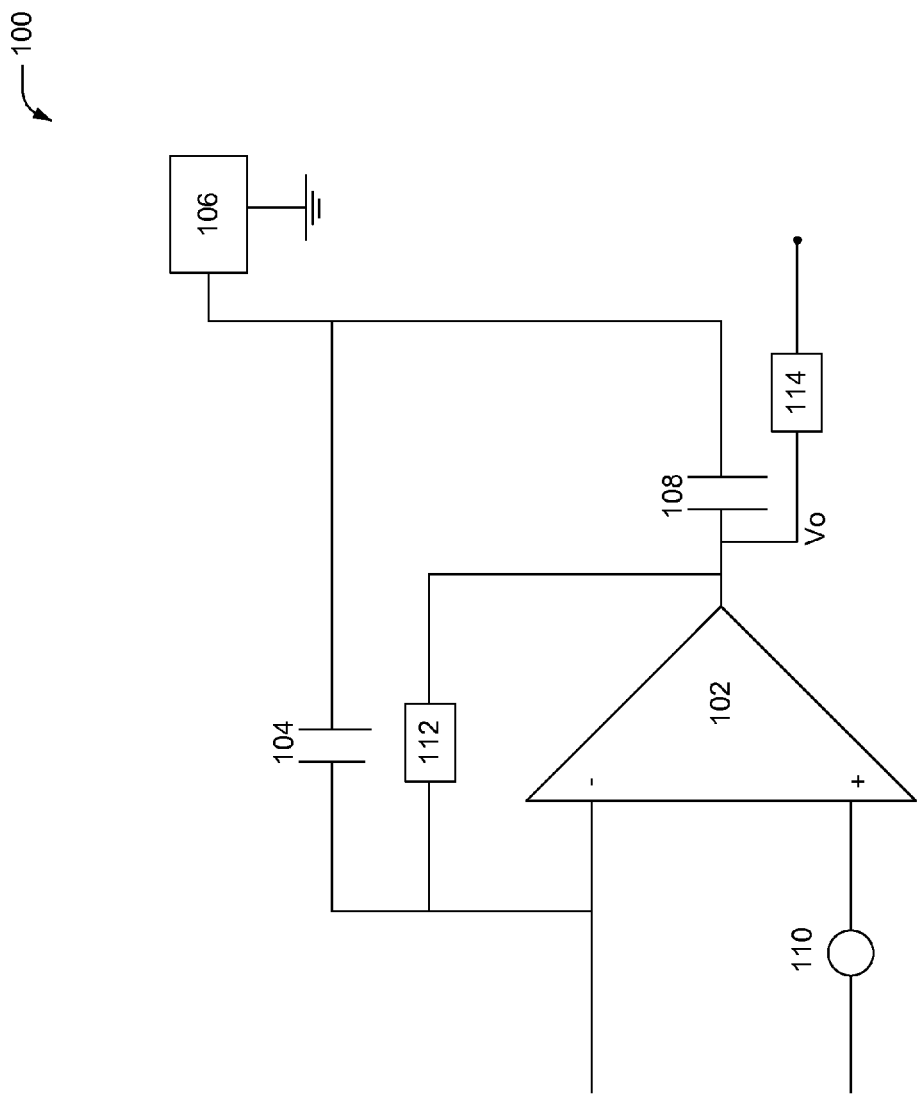
FIG. 1 is a schematic illustration of an example system that facilitates measurement of capacitance of an external device, according to an embodiment of the subject disclosure.

Referring now to FIG. 1, illustrated is a schematic illustration of an example system 100 that facilitates measurement of capacitance of an external device 106, according to an embodiment of the subject disclosure, where the capacitance of the external device 106 is unknown and the external device 106 is a high voltage device. System 100 facilitates determination (or measurement) of the capacitance by shielding the active elements that facilitate the capacitance measurement (e.g., amplifier 102; other examples of active devices include transistors and other integrated circuit elements) from the high voltage of the external device 106 that is outside the inherent voltage limitations of the active device.

In an embodiment, the external device 106 is a high voltage device that operates at a voltage higher than the inherent voltage limitations of an active device that facilitates the measurement of the capacitance. The inherent voltage limit of the active device can be a breakdown voltage. For example, the high voltage is greater than the breakdown voltage of the active device. A voltage greater than the breakdown voltage results in failure of the active device, leakage of current and reduction of the life of the active element. In modern technologies the breakdown voltage can be in the range of 1 V to 10 V, and the high voltage is greater than a voltage in the range of 1 V to 10 V.

One example of a high voltage device is a capacitive MEMS device. Generally, a high voltage is applied to a capacitive MEMS device such that elements of the capacitive MEMS device can be moved corresponding to the voltage. The positions of the elements can be determined according to the capacitance of the MEMS.

To isolate the active device (amplifier 102) from the high voltage, system 100 employs two capacitors 104 and 108 to store the high voltage of the external device 106 without letting the active device (amplifier 102) experience the high voltage. System 100 is different from a system that only uses a used a simple capacitive divider to facilitate measurement of the capacitance of the external device 106. A simple capacitive divider would ensure that the capacitance value detected by the detector device 114 would be divided by the ratio of the capacitors, which reduces the sensitivity of the acquisition circuit and provides a strongly non-linear reading. Instead, system 100 also utilizes an amplifier 102 (e.g., an operational amplifier) to facilitate measurement of the capacitance of the external device 106 in a more linear, higher sensitivity manner.

The amplifier 102 is an active device that operates under a low voltage, so the capacitors 104 and 108 shield the amplifier 102 from the high voltage of the external device 106. Since the amplifier 102 is shielded from the high voltage of the external device 106, the amplifier only is exposed to a low voltage applied by voltage source 110. Accordingly, the external device 106 can still operate at a high voltage without system 100 requiring a special high voltage precision device that would limit the choice of the technology, reduce precision, and increase production costs to sense the capacitance of the external device 106.

The amplifier 102 of system 100 has a positive input (+), a negative input (−) and an output. A capacitor 104 (or "first capacitor") is connected to the negative input (−) of the amplifier 102 and to the external device 106. A capacitor 108 (or "second capacitor") is connected to the output of the amplifier and to the external device 106. The first capacitor 104 and the second capacitor 108 store the high voltage applied to the external device 106 to shield the amplifier 102 and the detector device 114 from the high voltage. The "high voltage" refers to any voltage greater than the voltage applied during the measurement of the capacitance of the external device with system 100. Generally the high voltage is greater than the breakdown voltage of an active device.

To provide context for the "high voltage," several examples are provided. However, these examples are not meant to limit system 100 to applications with these particular voltages. It will be understood that the high voltage can be any voltage higher than a voltage limitation of an active device (e.g., amplifier 102). For example, in an embodiment, the high voltage is at least about eight Volts. In another embodiment, the high voltage is at least about nine Volts. In a further embodiment, the high voltage is at least about ten Volts.

The system 100 also includes a voltage source device 110. The voltage source device 110 supplies a low voltage to the positive input (+) of the amplifier 102. The low voltage does affect the output voltage of the amplifier 102 or the input voltage of the detector device 114. The "low voltage" can refer generally to any voltage less than the "high voltage." In other words, the low voltage can refer to any voltage less than the breakdown voltage of an active device in an integrated circuit.

To provide context for the "low voltage," several examples are provided. However, these examples are not meant to limit system 100 to applications with these particular voltages. It will be understood that the low voltage can be any voltage within the voltage limitations of an active device (e.g., amplifier 102). For example, in an embodiment, the low voltage is about five Volts or less. In another embodiment, the low voltage is about four Volts or less. In a further embodiment, the low voltage is about three Volts or less.

The low voltage is applied by the voltage source device 110 to the positive input (+) of the amplifier 102. The voltage (Vo) of the output of the amplifier 102 and the voltage of the negative input (−) of the amplifier 102 are driven to the same low voltage via a reset device 112. The reset device 112 connects the output of the amplifier 102 and the negative (−) input of the amplifier 102.

The reset device 112 can be any device that can provide both a low impedance that facilitates current flow and a high impedance that impedes or prevents current flow. Non-limiting examples of the reset device 112 are shown in FIG. 2-4.

Figure 2:
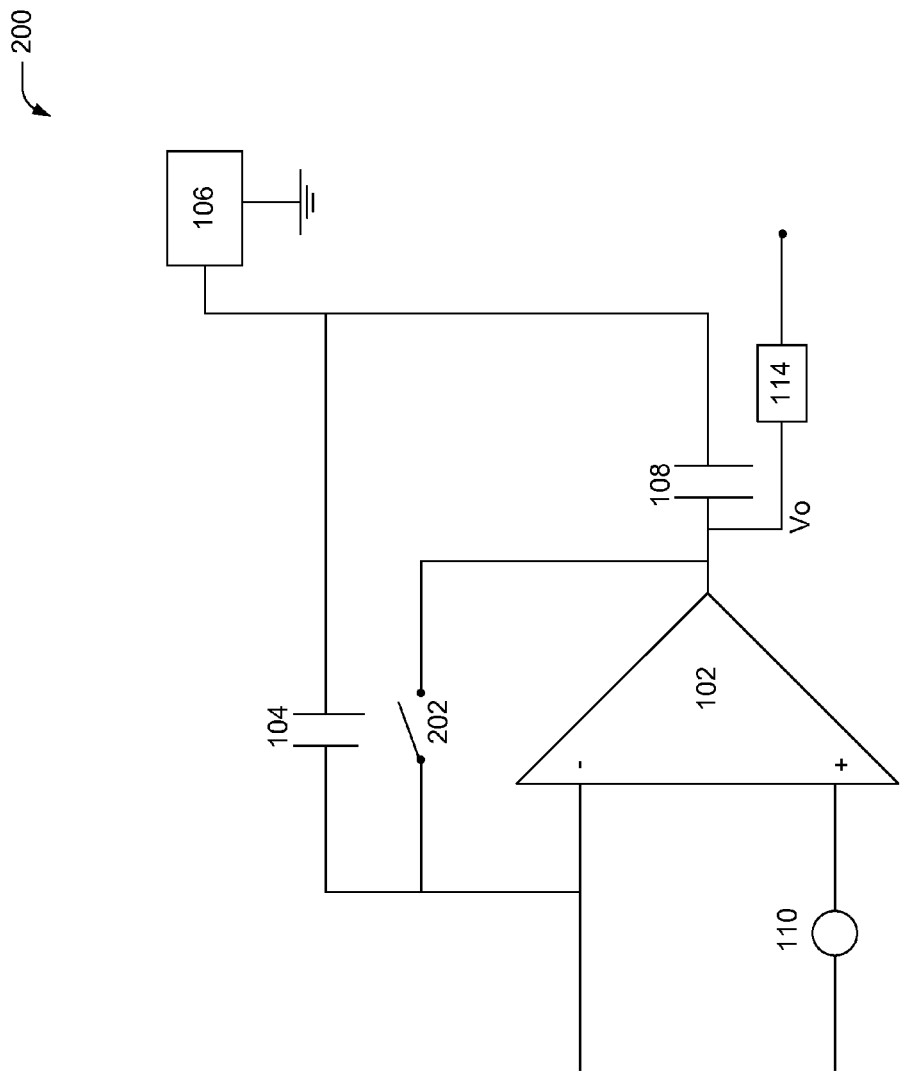
FIGS. 2-4 are schematic illustrations of the system that facilitates measurement of capacitance of an external device with different types of reset devices, according to an embodiment of the subject disclosure.
Figure 3:
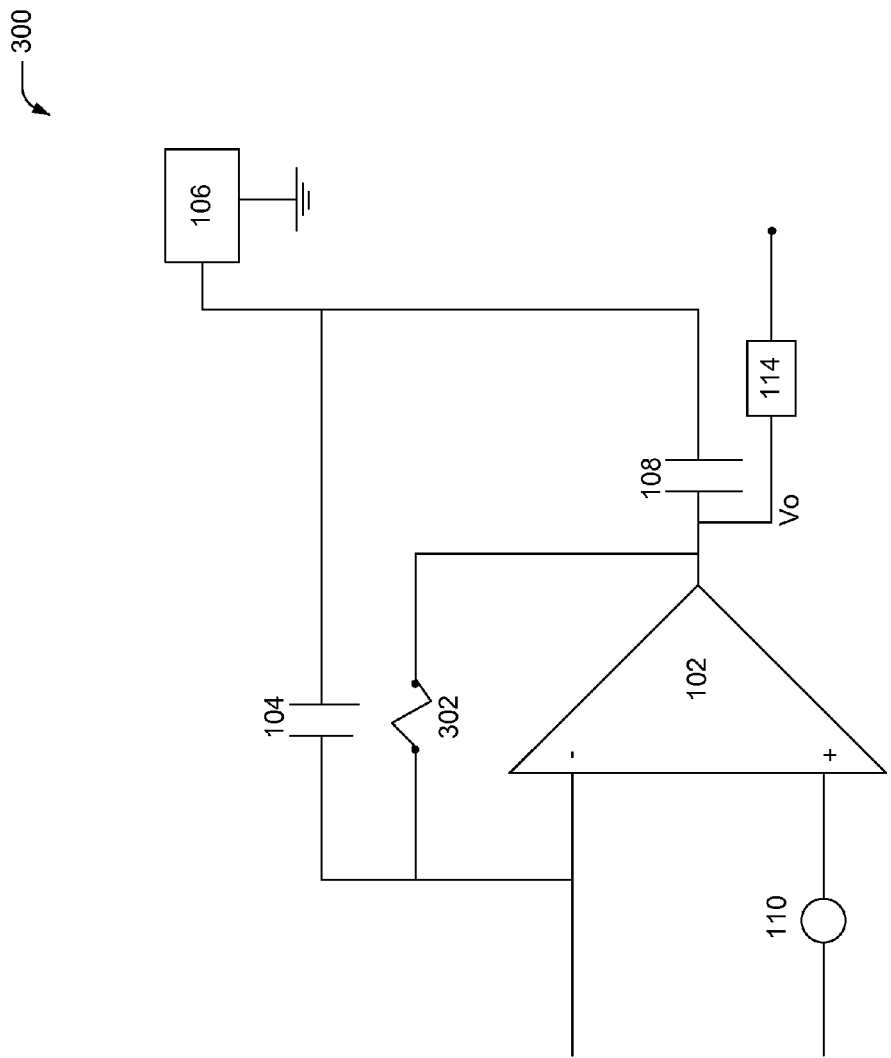
Figure 4:
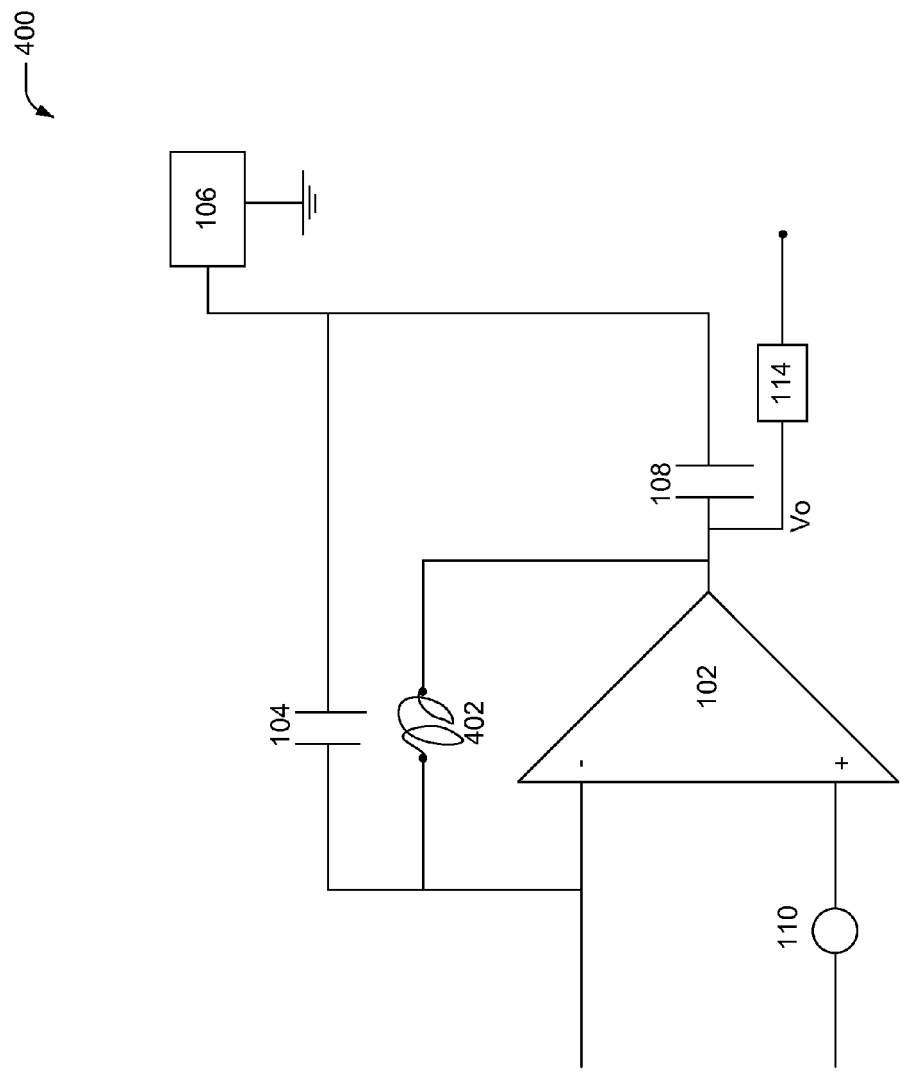

FIGS. 2-4 are schematic illustrations of example configurations of the system 200, 300, 400 that facilitates measurement of capacitance of an external device 106 with different reset devices 202, 302, 402. FIG. 2 shows a switch 202 being used as the rest device. FIG. 3 shows a resistor 302 being used as the reset device. FIG. 4 shows an inductor 402 being used as the reset device.

Referring back to FIG. 1, the detector device 114 of system 100 can determine, measure, detect, or the like, the capacitance of the external device 106. Detector device 114 is not exposed to the high voltage of the external device 106. The detector device 114 can be any device that can facilitate determination, measurement, detection, or the like, of the capacitance of the external device 106. In an embodiment, the detector device 114 can include an analog to digital convertor.

To facilitate determination of the capacitance, the low voltage applied at the positive input (+) of the amplifier 102 by the voltage source device 110 when the reset device 112 is at high impedance. For example, the voltage can be modified as a step or pulse. At the moment of the step or pulse, the voltage of the output (Vo) of the amplifier 102 represents the unknown capacitance of external device 106.

The detector device 114 measures a change in the output voltage of the amplifier 102 as a function of a change in the low voltage supplied by the voltage source and the unknown capacitance of the external device. The change in the output voltage of the amplifier 102 can also be a function of the capacitance of the second capacitor 108.

The range of the determination can be affected by several factors. The precision can be improved by setting the step or pulse to be small (e.g., having a small voltage difference from the original voltage supplied by the power source 110). The range can also be improved by setting the ratio of the unknown capacitance to the capacitance of the second capacitor 108 as large.

Figure 5:
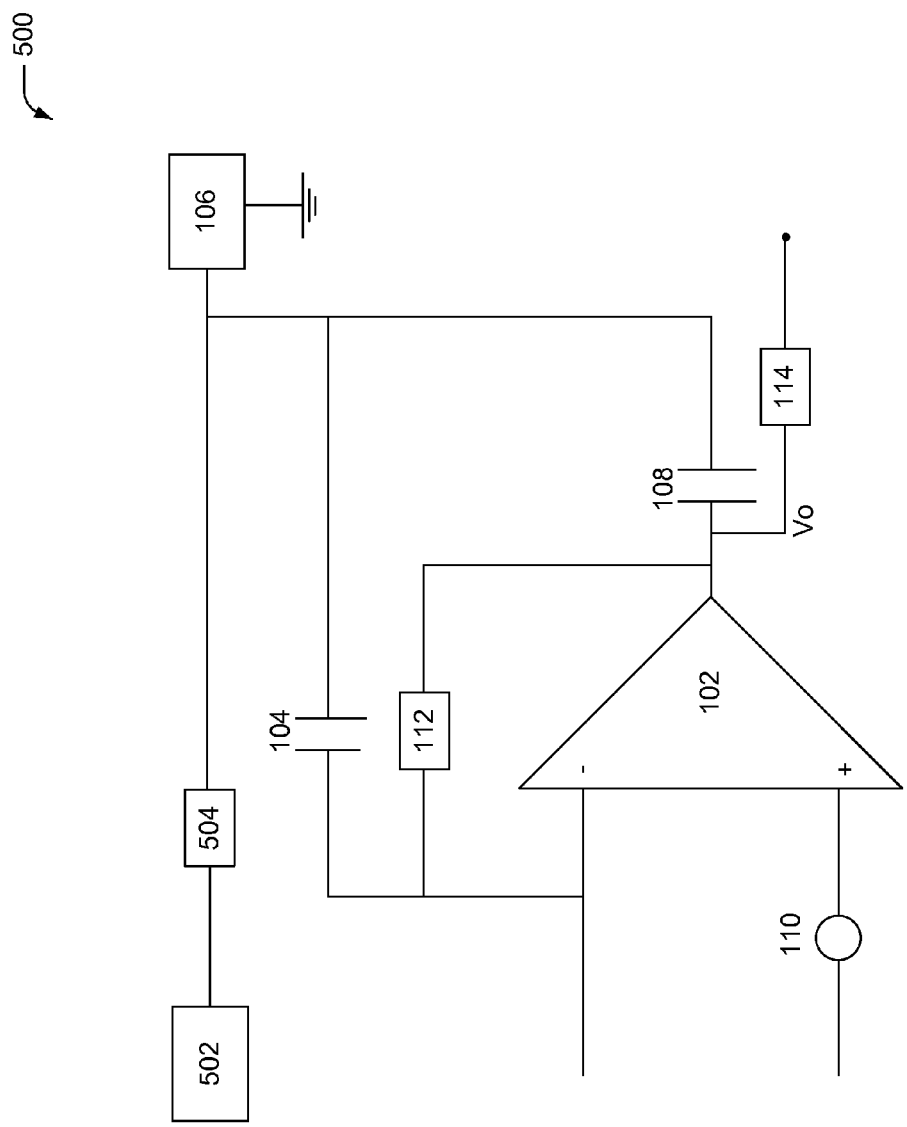
FIG. 5 is a schematic illustration of an example of a more detailed system that facilitates measurement of capacitance of an external device, according to an embodiment of the subject disclosure.

Referring now to FIG. 5, illustrated is a schematic illustration of an example system 500 that facilitates application of the high voltage to the external device 106, according to an embodiment of the subject disclosure. System 500 employs the two capacitors 104, 108, the amplifier 102, the voltage source 110, the reset device 112, the external device 106 and the detector device 114 as described above with respect to FIG. 1. System 500 additionally provides a mechanism for applying the high voltage to the external device 106. The high voltage can be stored by the two capacitors 104 and 108 to shield the rest of the system 500 (e.g., any active devices) from the high voltage.

System 500 illustrates a voltage gain device 502 that can generate the high voltage of the external device 106. The voltage gain device 502 can include, for example, a booster or a charge pump. System 500 also includes a connecting device 504 that connects the voltage gain device 502 to the external device 106 and the capacitors 104 and 108. The capacitors 104 and 108 isolate the rest of system 500 (e.g., the amplifier 102, which is an active device) from the high voltage of the voltage gain device 502. This allows the high voltage to be managed using regular modern technology with no extra costs related to special features like high voltage precision analog devices, so the circuitry of system 500 can remain highly integrated.

The connecting device 504 can be any device that can provide both a low impedance that facilitates current flow and a high impedance that impedes or prevents current flow. Non-limiting examples of the connecting device 504 are shown in FIG. 6-8.

Figure 6:
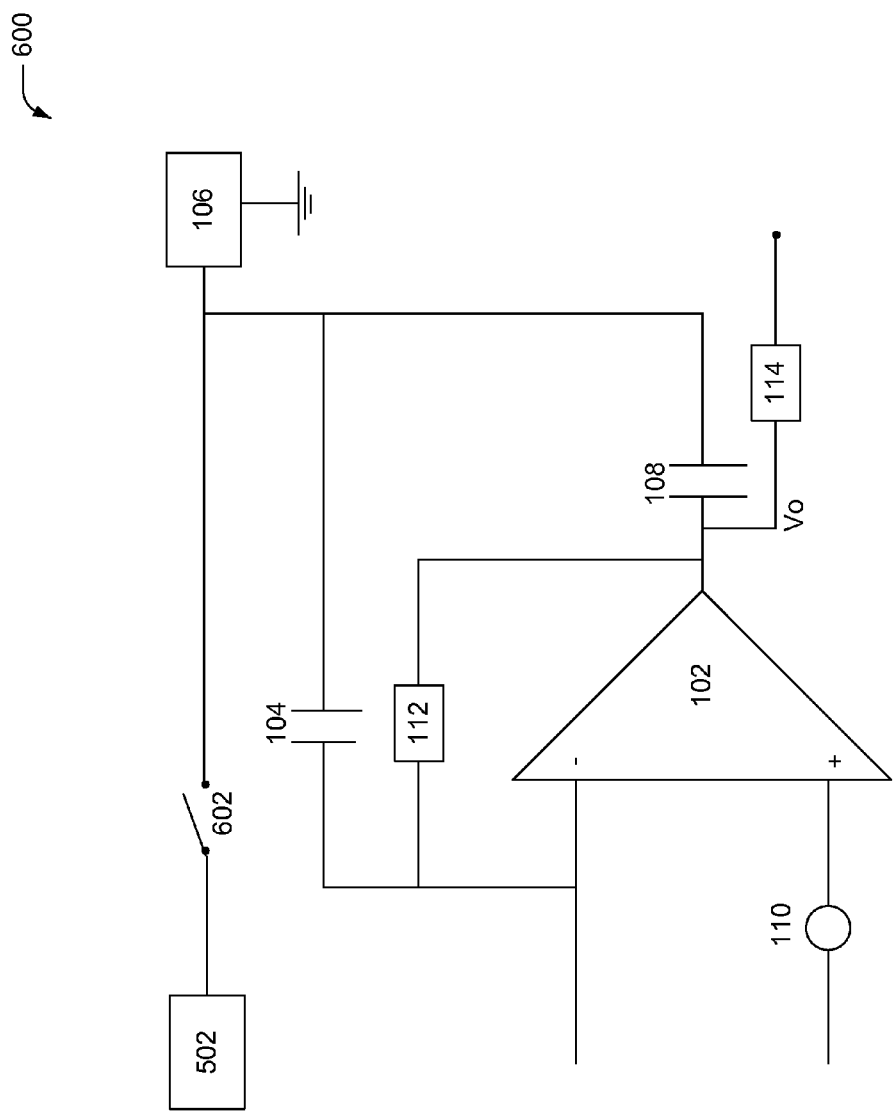
FIG. 6-8 are schematic illustrations of the more detailed system that facilitates measurement of capacitance of an external device with different types of connecting devices, according to an embodiment of the subject disclosure.
Figure 7:
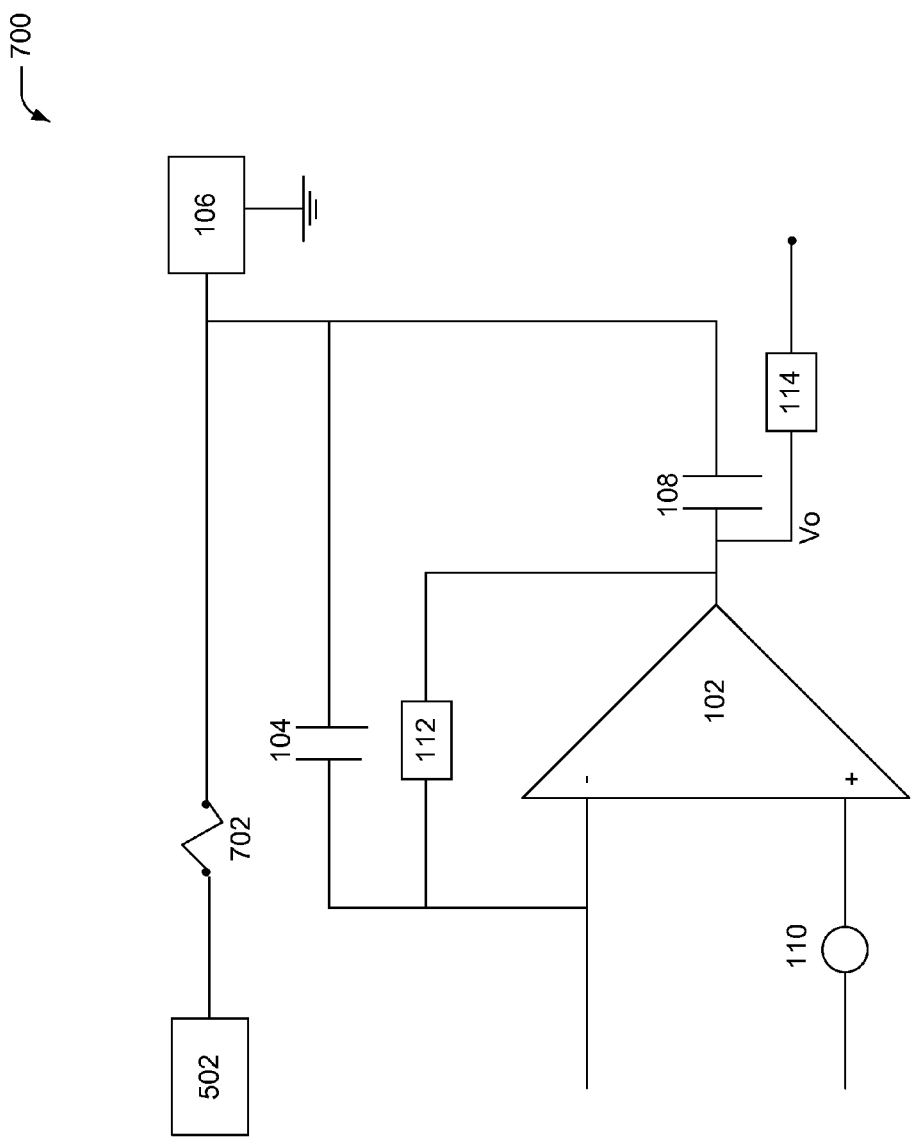
Figure 8:
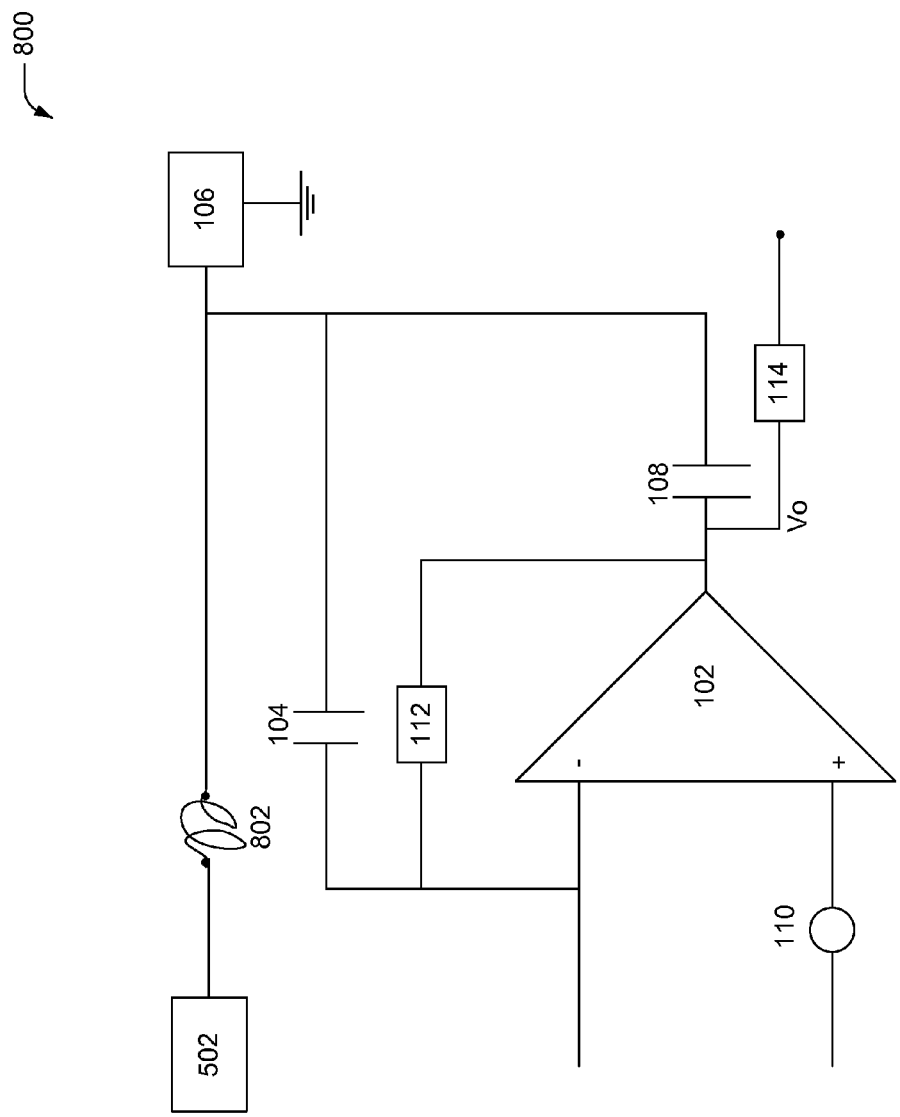

FIGS. 6-8 are schematic illustrations of example configurations of the system 600, 700, 800 that facilitates establishing the high voltage of the external device 106 with different connecting devices 602, 702, 802. FIG. 6 shows a switch 602 being used as the connecting device. FIG. 7 shows a resistor 702 being used as the connecting device. FIG. 8 shows an inductor 802 being used as the connecting device. It will be understood that the reset device 112 as shown in FIGS. 6-8 need not be the same variable impedance device as the connecting device 504. Moreover, the reset device can be any device that facilities transition between low impedance and high impedance, including those devices shown in FIG. 2-4.

Referring back to FIG. 5, when the reset device 112 and the connecting device 504 are at low impedance, the external device 106 receives the high voltage. The high voltage is also stored on the capacitors 104 and 106. During this time, since the reset device 112 provides low impedance, the voltage of the negative input is kept at the same voltage as the output (Vo) of the amplifier 102. The voltage of the output (Vo) is equal to the low voltage supplied by the voltage generator 110.

When the reset device 112 and the connecting device 504 are at high impedance, the voltage source 110 modifies the low voltage (e.g., via a pulse or step) to the positive input (+) of the amplifier. The modified voltage can be represented with respect to the low voltage as a change of Vd.

The output voltage of the amplifier 102 changes to force the voltage of negative input (−) of amplifier 102 to match the voltage of the positive input (+) of the amplifier (a change of Vd). Since the negative input (−) of the amplifier 102 is connected to the external device 106 through the first capacitor 104, the voltage of the external device 106 must also change by the same value (a change of Vd). For the voltage of the external device 106 to change by a value of Vd, the output voltage Vo must change by a voltage of (the capacitance of the external device 106 divided by the capacitance of the second capacitor 108)*Vd. Accordingly, the change in the output voltage (Vd) is a measure of the capacitance of the external device 106.

During the whole process, no active device is exposed to a high voltage. In other words, the voltages of the positive input (+) of the amplifier 102, the negative input (−) of the amplifier 102 and the output of the amplifier 102 remain at low voltages. The external device 106 and capacitors 104 and 108 see the high voltage supplied by the voltage gain device 502. The connector device 504, the reset device 112 and the output stage of the voltage gain device can be less precise (e.g., made of high voltage transistors or other components designed to support the high voltage). Additionally, by selecting the voltage difference Vd small and the ratio of the unknown capacitance of the external device 106 to the capacitance of the second capacitor 108 large, the value the capacitance fo the external device 106 can be determined over a wide range without generating an large voltage change on the external device 106 while the capacitance of the external device 106 is determined.

Figure 9:
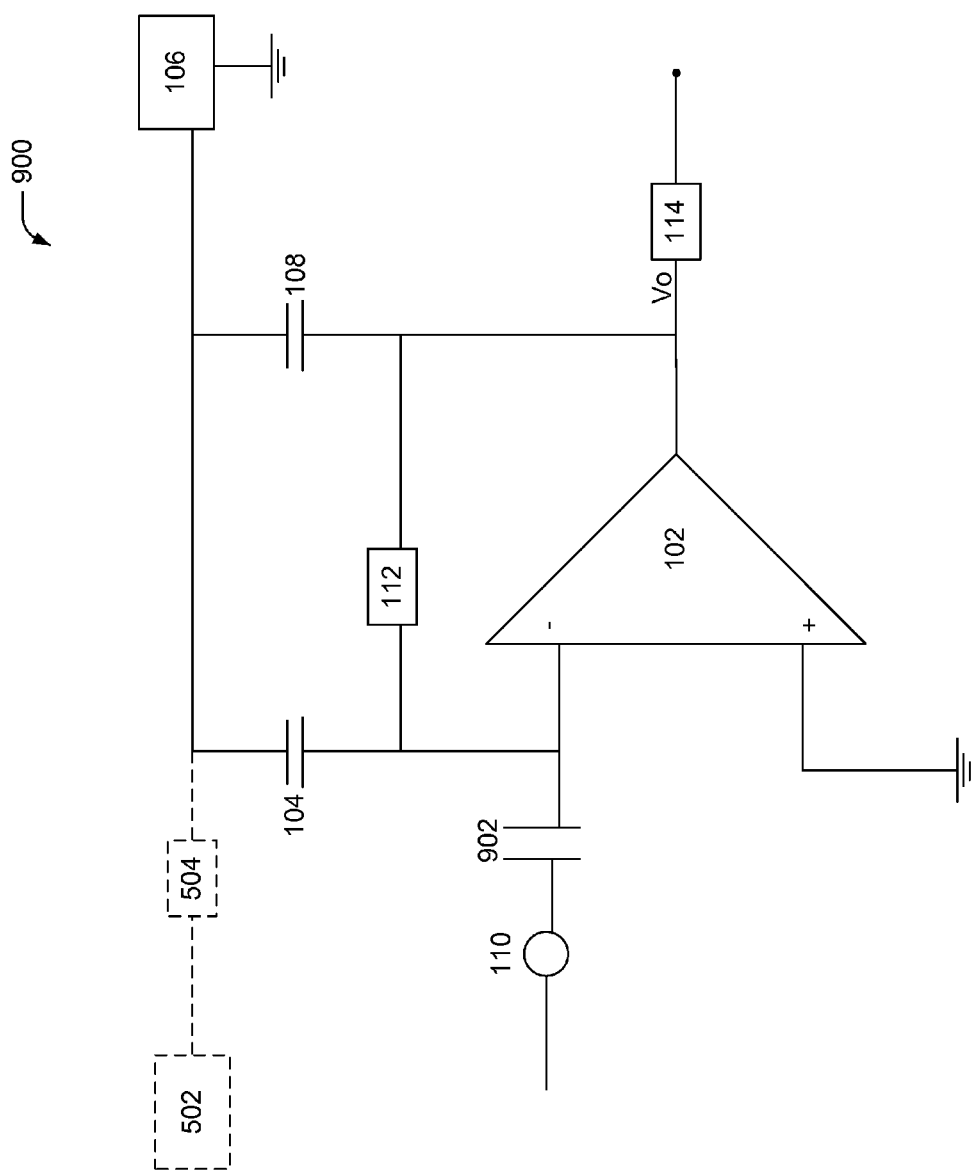
FIG. 9 is a schematic illustration of another example system that facilitates measurement of capacitance of an external device, according to an embodiment of the subject disclosure.
Figure 10:
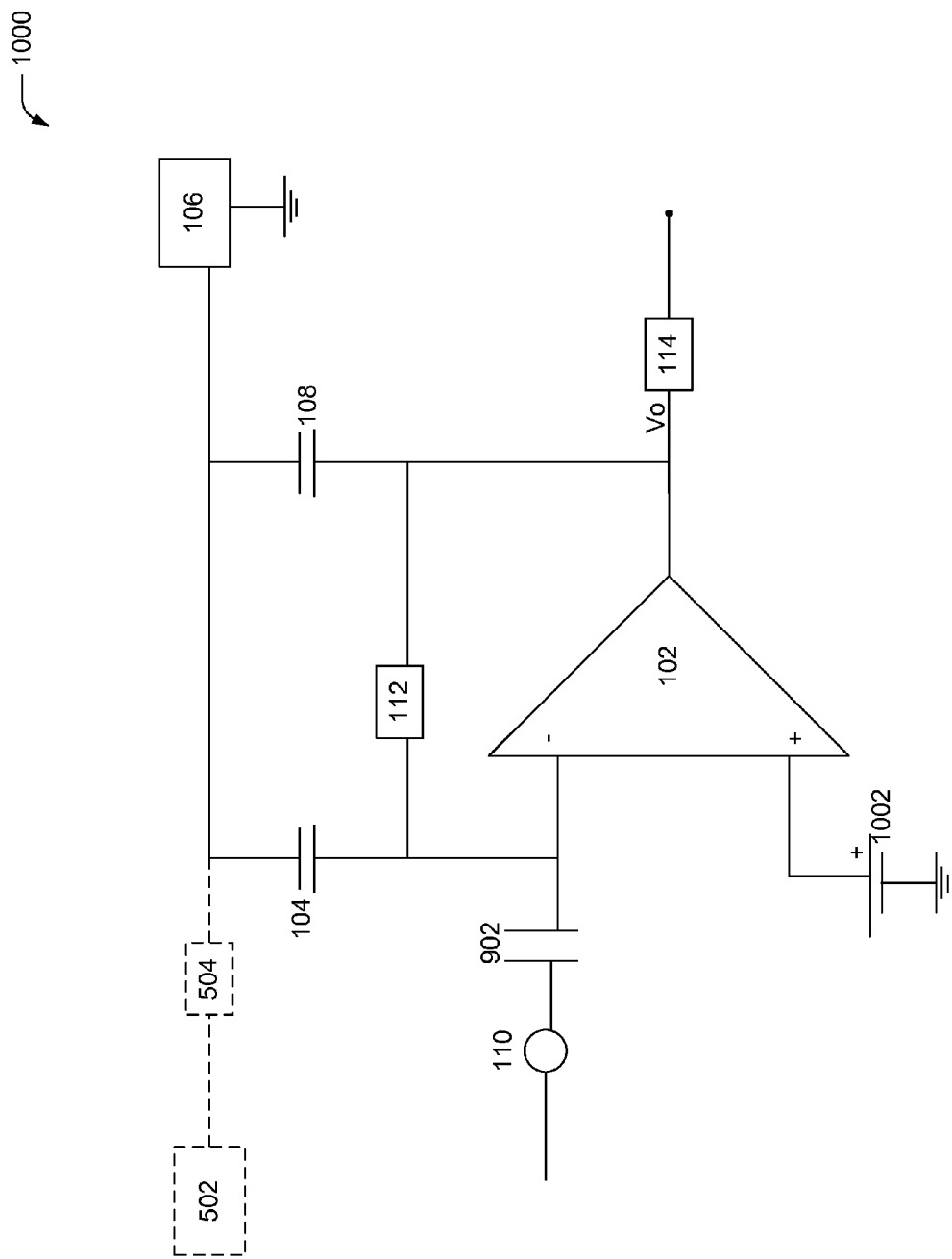
FIG. 10 is a schematic illustration of a further example system that facilitates measurement of capacitance of an external device, according to an embodiment of the subject disclosure.

Referring now to FIGS. 9 and 10, illustrated are alternate configurations that can be used in place of system 100. These configurations are merely examples and are not meant to be excusive. FIGS. 9 and 10 are meant to represent any configuration that limits or eliminates the potential change at the negative input (−) of the amplifier 102. Moreover, it will be understood that any configuration utilizing at least two capacitors to isolate active elements from high voltage are meant to fall under the scope of this disclosure, even configurations that do not limit or eliminate the potential change at the input of the amplifier 102.

FIG. 9 illustrates an amplifier 102 with the voltage source 102 and a capacitor 902 (the "third capacitor") at the negative input (−). Accordingly, the voltage source device is not connected to the positive input (+) of the amplifier 102, but to a third capacitor 902 connected between the voltage source 110 and the negative input (−) of the amplifier 102. The positive input (+) of the amplifier 102 is connected to ground.

FIG. 10 illustrates the amplifier 102 with the voltage source 110 and a capacitor 902 at the negative input (−) of the amplifier 102 and a voltage driver 1002 at the positive input (+) of the amplifier 102. Accordingly, the voltage source device is not connected to the positive input (+) of the amplifier 102, but to a third capacitor 902 connected between the voltage source and the negative input (−) of the amplifier 102. The positive input (+) of the amplifier 102 is connected to voltage driver 1002 that can provide a fixed bias voltage.

Further alternate configurations are possible that utilize different active devices than the amplifier 102 shown in FIGS. 1-10. An example of an alternate active device is a transistor. The configuration of the two capacitors 104 and 108 will change in a manner that will protect the transistor from the high voltage.

Figure 11:
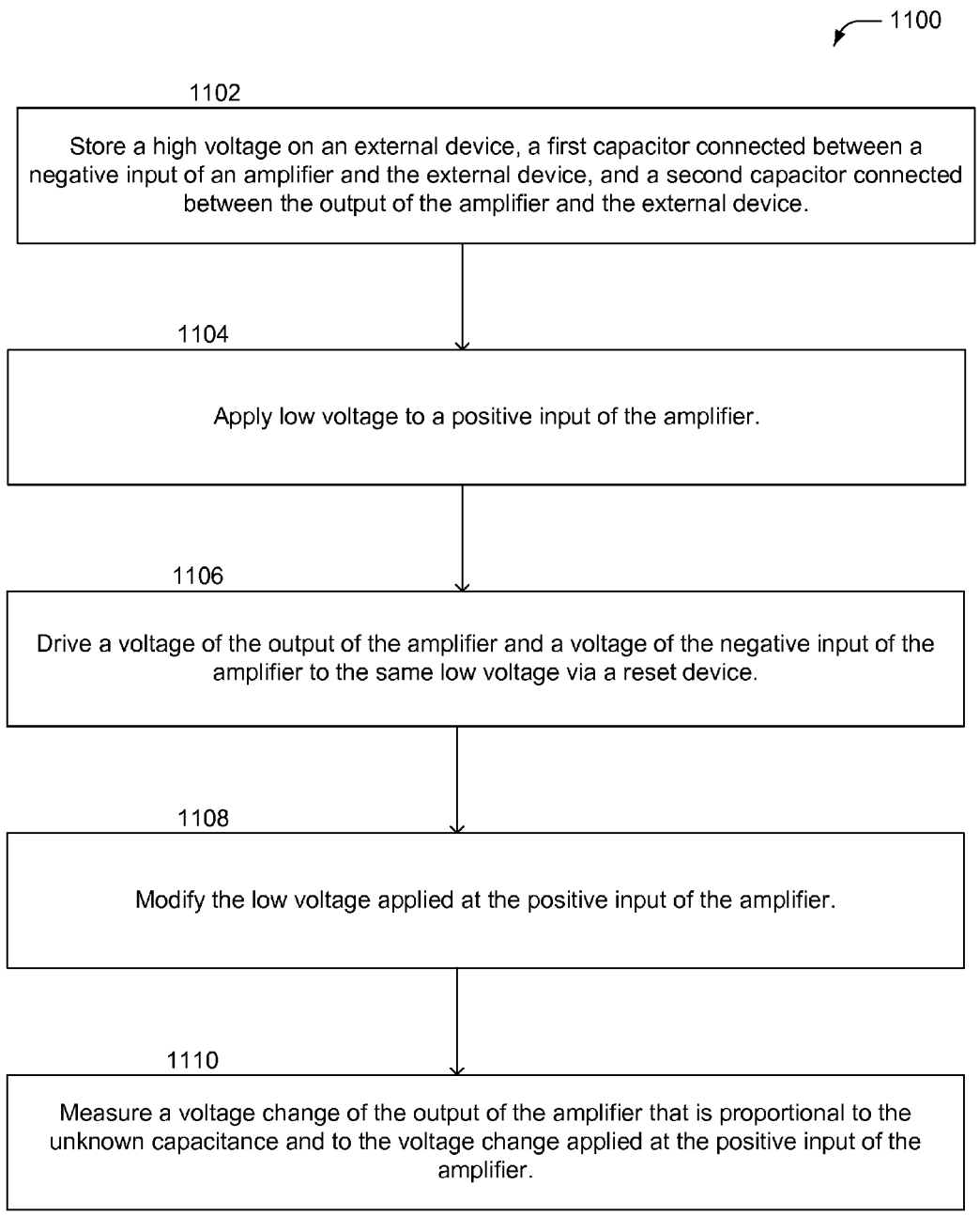
FIG. 11 is a process flow diagram of a method that facilitates measurement of capacitance of an external device, according to an embodiment of the subject disclosure.
Figure 12:
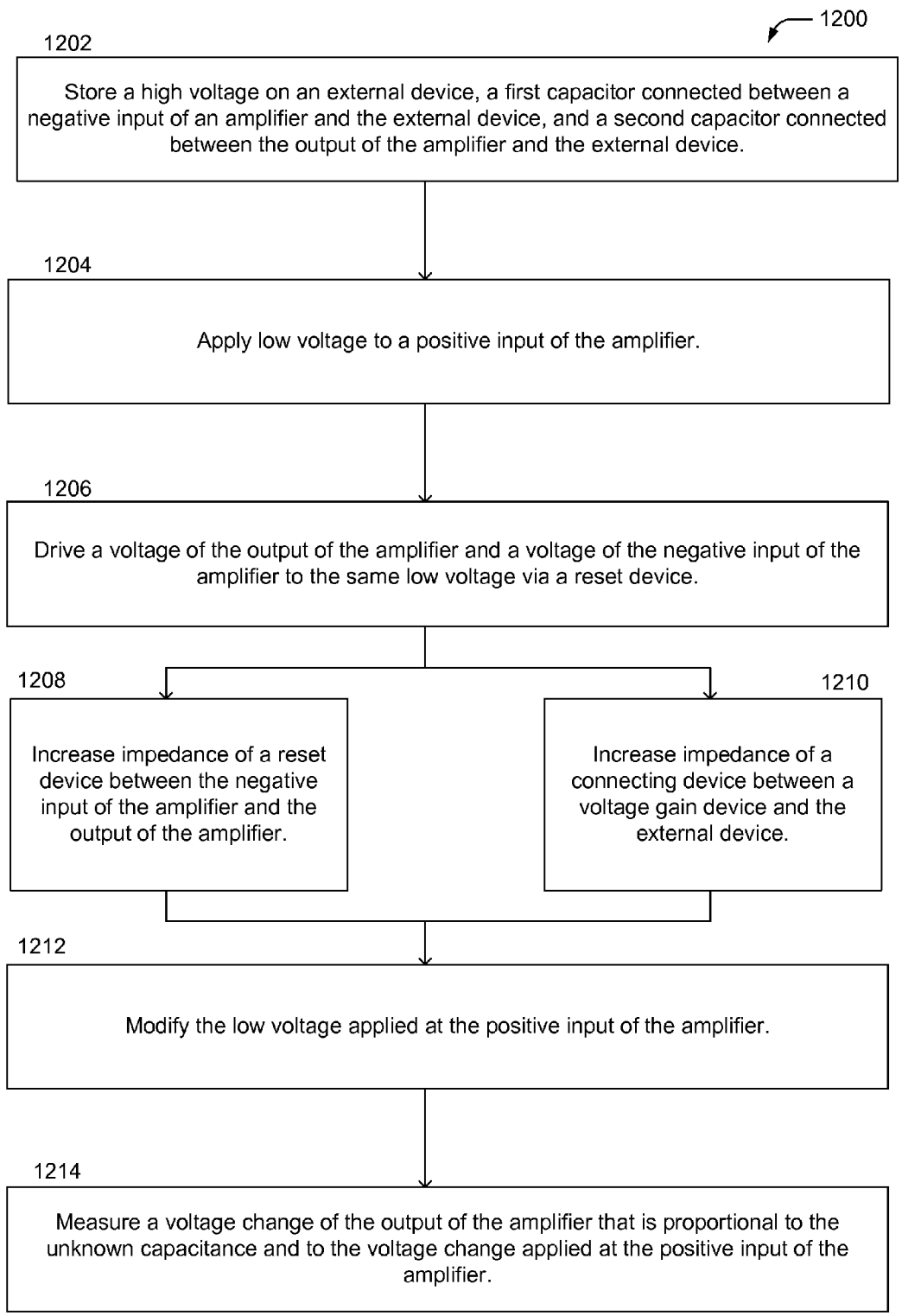
FIG. 12 is a process flow diagram of a more detailed method that further facilitates measurement of capacitance of an external device, according to an embodiment of the subject disclosure.

FIGS. 11 and 12 show methods illustrated as flow diagrams 1100 and 1200. For simplicity of explanation, the methods are depicted and described as series of acts. However, the methods are not limited by the acts illustrated and by the order of acts. For example, acts can occur in various orders and/or concurrently, and with other acts not presented and described herein. Furthermore, not all illustrated acts may be required to implement the methods. Additionally, it should be further appreciated that the methods can be implemented on an article of manufacture (e.g., within a circuit, such as an integrated circuit) to facilitate transporting and transferring the methods.

Referring now to FIG. 11, illustrated is a process flow diagram of a method 1100 that facilitates measurement of an unknown capacitance of a high voltage external device, according to an embodiment of the subject disclosure. The external device can be a high voltage device that operates at a higher voltage than the breakdown voltage of an active device within an integrated circuit (e.g., a capacitive MEMS device). Method 1100 can facilitate the measurement of the unknown capacitance of the external device while shielding the integrated circuitry of the measurement device from the high voltage without limiting the high voltage applied to the external device.

At element 1102, a high voltage is applied to the external device without reaching any active devices of the capacitance measurement circuit. This is due to two capacitors placed between the external device and the active devices of the capacitance measurement device that store the high voltage without letting the high voltage reach the active devices. In an example, the active device can be an amplifier. In this case, the two capacitors include a first capacitor connected between a negative input an amplifier and the external device and a second capacitor connected between the output of the amplifier and the external device. The high voltage is stored on an external device, the first capacitor and the second capacitor such that the amplifier does not see the high voltage of the external device. Accordingly, the external device can still operate at a high voltage without the capacitive sensing device requiring a special high voltage precision device that would limit the choice of the technology, reduce precision, and increase production costs to sense the capacitance of the external device.

The "high voltage" refers to any voltage greater than the voltage applied during the measurement of the capacitance of the external device with system 100. Generally the high voltage is greater than the breakdown voltage of an active device. To provide context for the "high voltage," several examples are provided. However, these examples are not meant to limit system 100 to applications with these particular voltages. For example, in an embodiment, the high voltage is at least about eight Volts. In another embodiment, the high voltage is at least about nine Volts. In a further embodiment, the high voltage is at least about ten Volts.

At element 1104, a low voltage is applied to a positive input of the amplifier. The low voltage is generally a voltage that does not affect the sensitivity of the active device, such as the amplifier. The "low voltage" can refer generally to any voltage less than the "high voltage." In other words, the low voltage can refer to any voltage less than the breakdown voltage of an active device in an integrated circuit.

To provide context for the "low voltage," several examples are provided. However, these examples are not meant to limit system 100 to applications with these particular voltages. For example, in an embodiment, the low voltage is about five Volts or less. In another embodiment, the low voltage is about four Volts or less. In a further embodiment, the low voltage is about three Volts or less.

At element 1106, a voltage of the output of the amplifier and the voltage of the negative input of the amplifier are driven to the same low voltage via a reset device. The reset device connects the output of the amplifier and the negative input of the amplifier. The reset device can be any device that can provide both a low impedance that facilitates current flow and a high impedance that impedes or prevents current flow. Non-limiting examples of the reset device include a resistor, a switch and an inductor.

At element 1108, the low voltage is modified at the positive input of the amplifier. The modification can be accomplished by the voltage source when the reset device is at high impedance. For example, the voltage can be modified as a step or pulse. At the moment of the step or pulse, the voltage of the output of the amplifier represents the unknown capacitance of external device. Accordingly, at element 1110, a voltage change of the output of the amplifier is measured that is proportional to the unknown capacitance and to the voltage change applied at the positive input of the amplifier. The change in the output voltage of the amplifier can also be a function of the capacitance of the second capacitor.

The precision of the determination can be affected by several factors. The precision can be improved by setting the step or pulse to be small (e.g., having a small voltage difference from the original voltage supplied by the voltage source). The precision can also be improved by setting the ratio of the unknown capacitance to the capacitance of the second capacitor as large.

Referring now to FIG. 12, illustrated is a process flow diagram of a method 1200 that further facilitates measurement of capacitance of an external device, according to an embodiment of the subject disclosure. Like method 1100, method 1200 can facilitate the measurement of the unknown capacitance of the external device while shielding the integrated circuitry of the measurement device from the high voltage without limiting the high voltage applied to the external device. The external device can be a high voltage device that operates at a higher voltage than the breakdown voltage of an active device within an integrated circuit (e.g., a capacitive MEMS device).

At element 1202, a high voltage is applied to the external device without reaching any active devices of the capacitance measurement circuit. This is due to two capacitors placed between the external device and the active devices of the capacitance measurement device that store the high voltage without letting the high voltage reach the active devices. In an example, the active device can be an amplifier. In this case, the two capacitors include a first capacitor connected between a negative input an amplifier and the external device and a second capacitor connected between the output of the amplifier and the external device. The high voltage is stored on an external device, the first capacitor and the second capacitor such that the amplifier does not see the high voltage of the external device. Accordingly, the external device can still operate at a high voltage without the capacitive sensing device requiring a special high voltage precision device that would limit the choice of the technology, reduce precision, and increase production costs to sense the capacitance of the external device.

The "high voltage" refers to any voltage greater than the voltage applied during the measurement of the capacitance of the external device with system 100. Generally the high voltage is greater than the breakdown voltage of an active device. To provide context for the "high voltage," several examples are provided. However, these examples are not meant to limit system 100 to applications with these particular voltages. For example, in an embodiment, the high voltage is at least about eight Volts. In another embodiment, the high voltage is at least about nine Volts. In a further embodiment, the high voltage is at least about ten Volts.

The high voltage can be supplied by a voltage gain device. The voltage gain device can be any device that can generate the high voltage required by the external device for operation. The voltage gain device can include, for example, a booster or a charge pump.

The voltage gain device can be connected to the external device and the capacitors through a connecting device. The connecting device can be any device that can provide both a low impedance that facilitates current flow and a high impedance that impedes or prevents current flow. For example, the connecting device can be a switch, a resistor or an inductor.

The capacitors isolate active devices used for measurement (e.g., measurement of the capacitance of the external device) from the high voltage of the voltage gain device. This allows the high voltage to be managed using regular modern technology with no extra costs related to special features like high voltage precision analog devices, so the circuitry of the measurement system can remain highly integrated.

At element 1204, a low voltage is applied to a positive input of the amplifier. The low voltage is generally a voltage that does not affect the sensitivity of the active device, such as the amplifier. The "low voltage" can refer generally to any voltage less than the "high voltage." In other words, the low voltage can refer to any voltage less than the breakdown voltage of an active device in an integrated circuit.

To provide context for the "low voltage," several examples are provided. However, these examples are not meant to limit system 100 to applications with these particular voltages. For example, in an embodiment, the low voltage is about five Volts or less. In another embodiment, the low voltage is about four Volts or less. In a further embodiment, the low voltage is about three Volts or less.

At element 1206, a voltage of the output of the amplifier and the voltage of the negative input of the amplifier are driven to the same low voltage via a reset device. The reset device connects the output of the amplifier and the negative input of the amplifier. The reset device can be any device that can provide both a low impedance that facilitates current flow and a high impedance that impedes or prevents current flow. Non-limiting examples of the reset device include a resistor, a switch and an inductor.

When the rest device and the connecting device are at low impedance, the external device receives the high voltage and the high voltage is stored on the capacitors. During this time, since the rest device provides low impedance, the voltage of the negative input is kept at the same voltage as the output of the amplifier, which is equal to the low voltage supplied by the voltage generator.

At element 1208, an impedance of the reset device between the negative input of the amplifier and the output of the amplifier is increased. At element 1210, an impedance of the connecting device between a voltage gain device and the external device is increased. With the reset device and the connecting device each at high impedance, at element 1212, the low voltage is modified at the positive input of the amplifier (e.g., by the voltage source).

The output voltage of the amplifier changes to force the voltage of the negative input of the amplifier to match the voltage of the positive input of the amplifier. Since the negative input of the amplifier is connected to the external device through the first capacitor, the voltage of the external device must also change by the same value. For the voltage of the external device to change by the same value as the change in the output voltage, the output voltage must change by a voltage of (the capacitance of the external device divided by the capacitance of the second capacitor) multiplied by the value of the voltage change.

At element 1214, the voltage change of the output of the amplifier is measured that is proportional to the unknown capacitance and to the voltage change applied at the positive input of the amplifier. Accordingly, the change in the output voltage is a measure of the capacitance of the external device.

During the whole process, no active device is exposed to a high voltage. In other words, the voltages of the positive input of the amplifier, the negative input of the amplifier and the output of the amplifier remain at low voltages. The external device and capacitors see the high voltage supplied by the voltage gain device. The connector device, the reset device and the output stage of the voltage gain device can be less precise (e.g., made of high voltage transistors or other components designed to support the high voltage). Additionally, by selecting the voltage difference small and the ratio of the unknown capacitance of the external device 106 to the capacitance of the second capacitor large, the value the capacitance fo the external device 106 can be determined with high precision without generating an large voltage change on the external device while the capacitance of the external device is determined.

Figure 13:
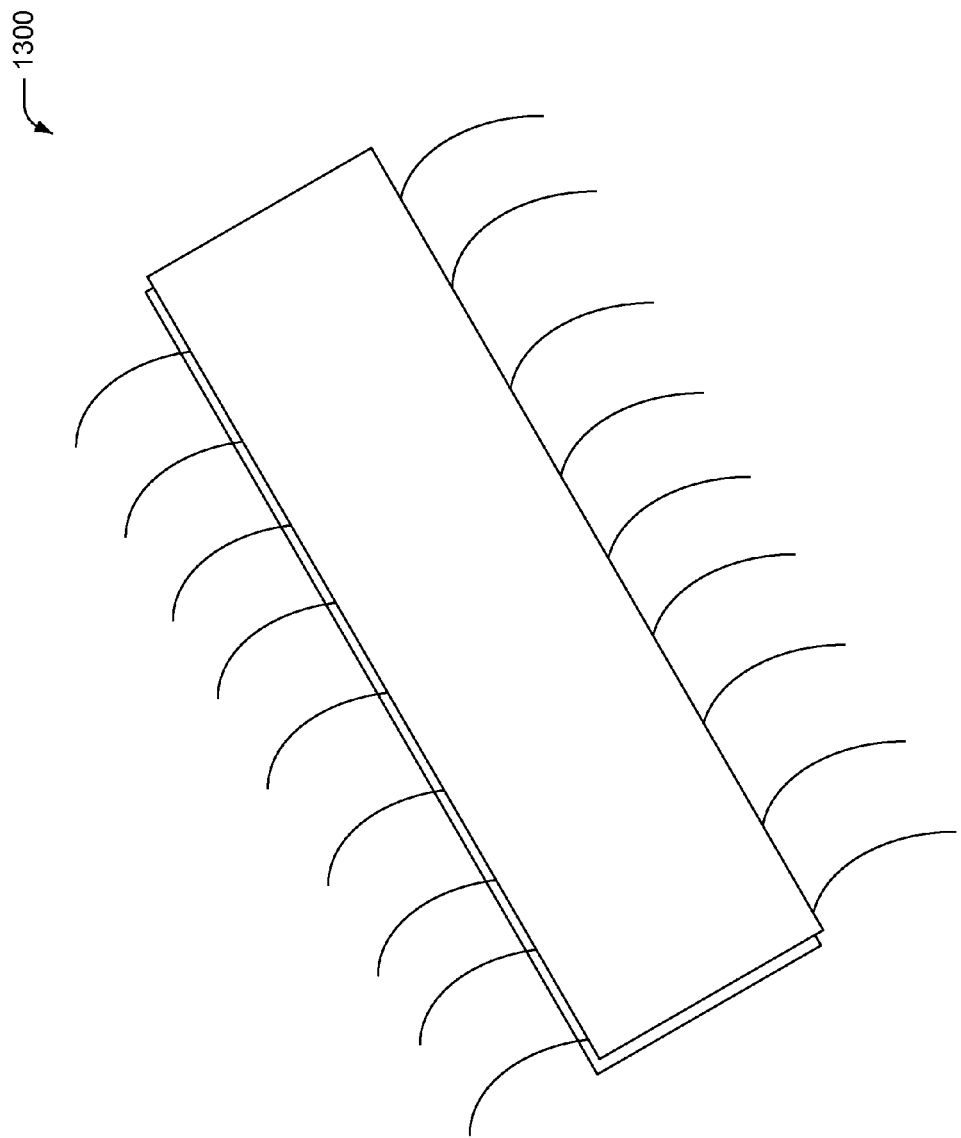
FIG. 13 is an example integrated circuit that can facilitate applications of the systems and methods according to the embodiments described in the subject disclosure.
Figure 14:
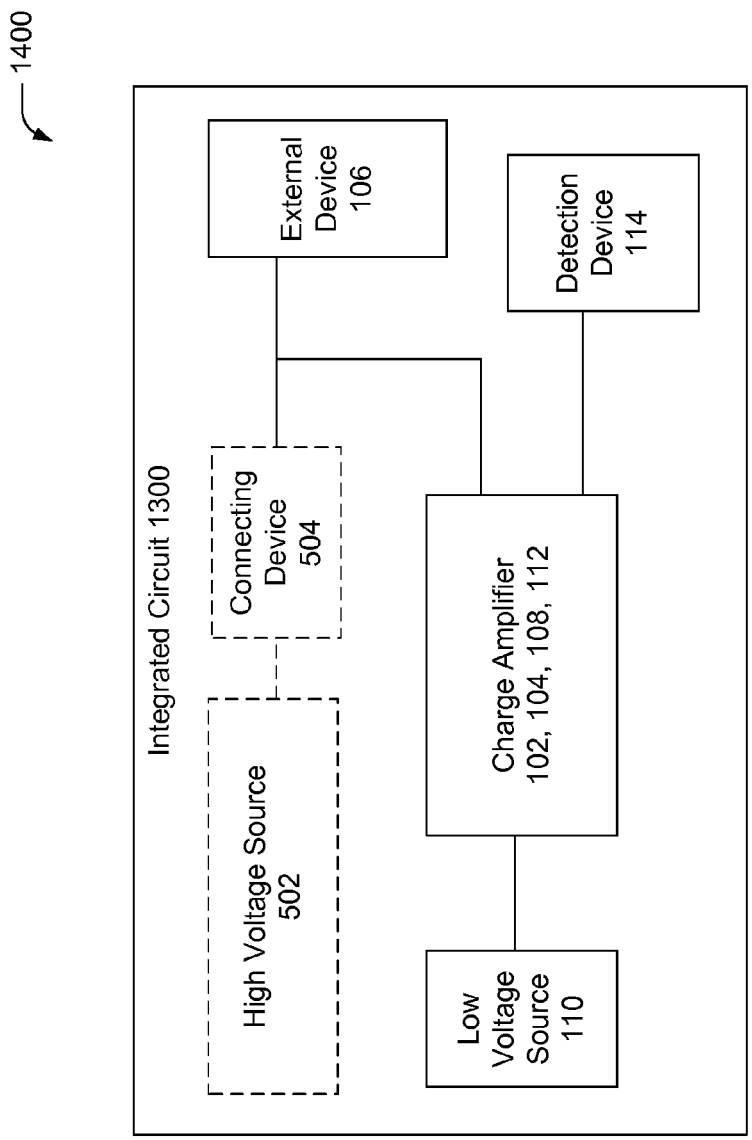
FIG. 14 is an example configuration of components within an integrated circuit that facilitate the applications of the systems and methods according to the embodiments described in the subject disclosure.

FIGS. 13 and 14 are intended to provide example implementations of the systems and methods of FIGS. 1-12. FIG. 13 is an example integrated circuit 1300 that can facilitate applications of the systems and methods according to the embodiments described in the subject disclosure. FIG. 14 is an example configuration 1400 of components within an integrated circuit 1300 that facilitate the applications of the systems and methods according to the embodiments described in the subject disclosure. It will be understood that other configurations can be used to facilitate applications of the systems and methods of FIGS. 1-12 and that FIGS. 13 and 14 provide just two example configurations.

The above description of illustrated embodiments, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

In this regard, while the described subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. A system, comprising:
an amplifier comprising a positive input, a negative input, and an output;
a first capacitor connected to the negative input of the amplifier and to an external device with an unknown capacitance, wherein the first capacitor stores a first voltage;
a second capacitor connected to the output of the amplifier and to the external device, wherein the second capacitor stores the first voltage;
a voltage source device that supplies a second voltage to the positive input of the amplifier;
a reset device that connects the output of the amplifier and the negative input of the amplifier; and
a detector device that measures a change in the output voltage of the amplifier as a function of a change in the second voltage supplied by the voltage source and function of the unknown capacitance of the external device, wherein the first voltage is higher than the second voltage.

2. The system of claim 1, wherein the reset device is a switch, a resistor or an inductor.

3. The system of claim 1, wherein the reset device, operating together with the amplifier, forces the output voltage of the amplifier and the voltage of the negative input of the amplifier to match the voltage of the positive input of the amplifier.

4. The system of claim 1, further comprising:
a charge generator device that facilitates driving the first capacitor, the second capacitor, and the unknown capacitance of the external device to store the first voltage; and
a connecting device between the charge generator device and the external device that provides a first impedance sufficient to facilitate current flow when the charge generator device drives the first capacitor, the second capacitor, and the unknown capacitance of the external device to store the first voltage and that provides a second impedance sufficient to impede current flow when the voltage source supplies the second voltage to the positive input of the amplifier.

5. The system of claim 4, wherein the connecting device is a switch, a resistor or an inductor.

6. The system of claim 4, wherein the reset device provides a third impedance sufficient to facilitate current flow when the charge generator device drives the first capacitor, the second capacitor, and the unknown capacitance of the external device to store the first voltage and provides a fourth impedance sufficient to impede current flow when the voltage source device supplies the second voltage to the positive input of the amplifier.

7. The system of claim 1, wherein the voltage source device comprises a pulse generator.

8. The system of claim 1, wherein the detector device comprises an analog to digital convertor.

9. The system of claim 1 where the voltage source device is not connected to the positive input of the amplifier, but to a third capacitor that is connected between the voltage source and the negative input of the amplifier, the positive input amplifier being connected to ground or to a fixed bias voltage.

10. A method, comprising:
storing a first voltage on an external device with an unknown capacitance, on a first capacitor between a negative input of an amplifier and the external device, and on a second capacitor connected between the output of the amplifier and the external device;

applying a second voltage to a positive input of the amplifier;

driving a voltage of the output of the amplifier and a voltage of the negative input of the amplifier to the second voltage via a reset device;

modifying the second voltage applied at the positive input of the amplifier;

measuring a voltage change of the output of the amplifier that is proportional to the unknown capacitance and to the voltage change applied at the positive input of the amplifier, wherein the first voltage is higher than the second voltage.

11. The method of claim 10, further comprising:
increasing the impedance of a connecting device between a voltage gain device and the external device with the unknown capacitance before modifying the second voltage applied at the positive input of the amplifier.

12. The method of claim 10, further comprising:
increasing the impedance of a reset device between the negative input of the amplifier and the output of the amplifier before modifying the second voltage applied at the positive input of the amplifier.

13. The method of claim 10, wherein the second voltage is about five Volts or less.

14. The method of claim 10, wherein the first voltage is at least about eight Volts.

15. The method of claim 10, wherein the applying further comprises applying a pulse on the second voltage to the positive input of the amplifier.

16. The method of claim 10, wherein the voltage change at the output of the amplifier corresponds to the voltage change of the pulse of the second voltage multiplied by a ratio of the unknown capacitance to the second capacitance.

17. A capacitance measuring circuit, comprising:
an amplifier comprising a positive input, a negative input, and an output;

a first capacitor connected to the negative input of the amplifier and to an external device with an unknown capacitance, wherein the first capacitor stores a first voltage;

a second capacitor connected to the output of the amplifier and to the external device, wherein the second capacitor stores the first voltage; and a reset device that connects the output of the amplifier and the negative input of the amplifier and facilitates driving the output of the amplifier and the negative input of the amplifier to a second voltage supplied by a voltage source device to the positive input of the amplifier, wherein a change in the output voltage of the amplifier as a result of a change of voltage supplied by the voltage source is a function of the unknown capacitance of the external device, and wherein the first voltage is higher than the second voltage.

18. The capacitance measuring circuit of claim 17, further comprising a connection device between a charge generator device and the external device that provides a first impedance sufficient to facilitate current flow when the charge generator device drives the first capacitor, the second capacitor, and the unknown capacitance of the external device to store the first voltage and that provides a second impedance sufficient to impede current flow when the voltage source supplies the second voltage to the positive input of the amplifier.

19. The capacitance measuring circuit of claim 18, wherein the connection device is a switch, a resistor or an inductor.

20. The capacitance measuring circuit of claim 17, wherein the reset device is a switch, a resistor or an inductor.

* * * * *